United States Patent [19]

Spellman et al.

[11] 4,213,067
[45] Jul. 15, 1980

[54] INTEGRATED GATE TURN-OFF DEVICE WITH NON-REGENERATIVE POWER PORTION AND LATERAL REGENERATIVE PORTION HAVING SPLIT EMISSION PATH

[75] Inventors: Gordon B. Spellman, Mequon; Herman P. Schutten, Elm Grove; Stanley V. Jaskolski, Sussex, all of Wis.

[73] Assignee: Eaton Corporation, Cleveland, Ohio

[21] Appl. No.: 972,444

[22] Filed: Dec. 22, 1978

[51] Int. Cl.² ................ H03K 17/60; H01L 29/74
[52] U.S. Cl. ...................... 307/252 C; 307/252 G; 307/252 J; 307/252 K; 307/305; 357/35; 357/36; 357/38
[58] Field of Search ........... 307/252 C, 252 G, 252 J, 307/252 K, 305; 357/37, 38, 35, 36

[56] References Cited

U.S. PATENT DOCUMENTS

| 3,265,909 | 8/1966 | Gentry | 357/38 |
| 3,694,670 | 9/1972 | Marzolf | 357/38 |
| 3,878,551 | 4/1975 | Callahan | 357/38 |
| 3,979,766 | 9/1976 | Tsuyuki | 357/38 |
| 4,071,779 | 1/1978 | Kawanami et al. | 307/252 G |
| 4,084,110 | 4/1978 | Okuhara et al. | 307/252 G |
| 4,112,315 | 9/1978 | Ohhinata | 307/252 G |
| 4,125,787 | 11/1978 | Ohhinata et al. | 307/252 C |

*Primary Examiner*—Joseph E. Clawson, Jr.
*Attorney, Agent, or Firm*—Hugh R. Rather; William A. Autio

[57] ABSTRACT

A gate turn-off device is formed by the integration of a power transistor with a lateral thyristor. The thyristor has a split emission path from its emitter, part of the emitter current completing a regenerative loop to maintain conduction after removal of a gating signal, and the remainder of the emitter current supplying base drive to the power transistor to render the latter conductive. In the ON state of the device, most of the load current flows through the power transistor, with only a small holding current flowing through the thyristor. Because of the low level of holding current, the thyristor is easily turned off by a small negative gating signal, breaking the regenerative loop, thus terminating emitter current whereby there is no base drive for the power transistor and hence the device is OFF.

5 Claims, 2 Drawing Figures

INTEGRATED GATE TURN-OFF DEVICE WITH NON-REGENERATIVE POWER PORTION AND LATERAL REGENERATIVE PORTION HAVING SPLIT EMISSION PATH

BACKGROUND OF THE INVENTION

Gate turn-off devices are known in the art. Generally, a thyristor can be turned on with a small gating signal of one polarity, say positive. Since a thyristor is a regenerative element, it will stay conductive above a certain minimum holding current flowing between its main terminals, even if gate drive is removed. Such thyristor can typically be turned off by a negative gating signal. For low level conduction current through the thyristor, say only slightly above the minimum holding current, only a small negative gating signal is necessary to turn it off. However, when the thyristor is conducting heavily with a high amount of current flow therethrough, turn-off is difficult or impossible and requires a substantially larger negative gating signal.

Numerous schemes are known for accomplishing turn-off. One approach is to supply the requisite high level off signal by means of a short duration, high level pulse, for example by capacitor discharge.

Another approach is to attack the problem from a different angle and attempt to reduce the requisite magnitude of the off signal necessary to achieve turn-off. For example, rather than using a thyristor alone as the power switching element, it is instead used as a low level regeneration element to control a non-regenerative power element (i.e. continual gating or driving current is necessary to maintain conduction). The thyristor is connected to drive the power element into conduction such that the latter carries load current and the thyristor carries only a small on current which is above its minimum holding value and which is also above the minimum driving current necessary to maintain continued conduction of the power element. It is thus generally known to employ the combination of a low level regeneration element controlling a high current capacity non-regenerative element in order to achieve high turn-off gain by breaking the regenerative loop with a low level signal.

The integration of a vertical SCR and a vertical power transistor is known. The SCR and the transistor operate in parallel with the transistor carrying most of the load current. The base region of the transistor is common with one of the interior regions of the SCR, whereby when the SCR is conductive, there is supplied base drive to the transistor and the latter conducts. Since only a low level current flows through the SCR, it is easily turned off, by a negative gating signal, which breaks the regenerative loop, thus terminating base drive for the transistor and the device is turned off.

SUMMARY OF THE INVENTION

The present invention relates to improvements in gate turn-off devices of the type having an SCR integrated with a power transistor, and is directed to the integration of non-regenerative power means with lateral regenerative means having a split emission path.

The integrated configuration preferably includes: a power transistor, preferably vertical and with a reverse blocking diode in series therewith; a lateral SCR having a split emission path from its anode emitter, part of the anode emitter current flowing to the rest of the SCR to complete a regenerative loop therethrough, and the remainder of the anode emitter current flowing to the base of the transistor to drive the latter into conduction; resistance formed by the lateral dimension of the anode emitter on the SCR side to increase emission to the transistor on the other side; and resistance formed by the lateral dimension of the transistor base to prevent regenerative action between the anode emitter and the transistor.

DESCRIPTION OF THE PREFERRED EMBODIMENT

Figure 1:
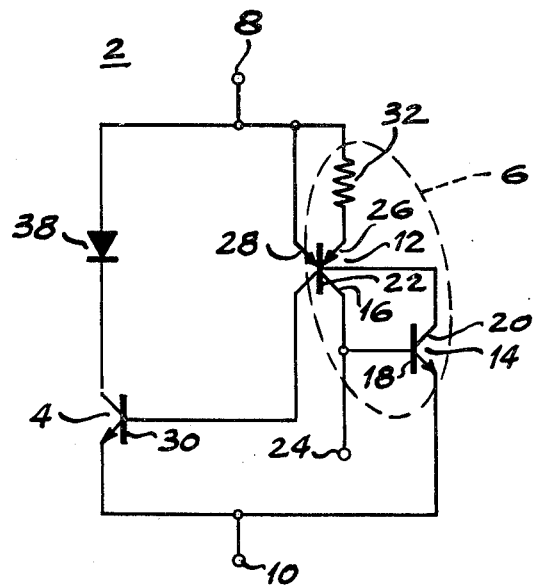
FIG. 1 is a circuit diagram of a gate turn-off device constructed in accordance with the invention.
Figure 2:
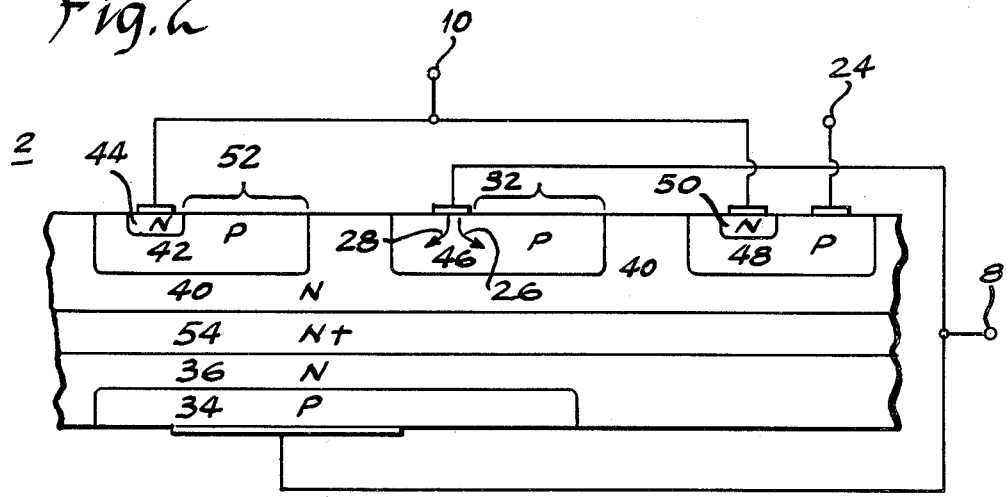
FIG. 2 is a substrate diagram showing the integral configuration of a gate turn-off device constructed in accordance with the invention.

FIGS. 1 and 2 show a gate turn-off device generally designated by the reference character 2. Referring to FIG. 1, an NPN power transistor 4 is connected in parallel with SCR 6 across main anode terminal 8 and main cathode terminal 10 carrying load current. The SCR comprises a pair of composite transistors, PNP transistor 12 and NPN transistor 14. The collector 16 of transistor 12 is connected to the base 18 of transistor 14, and the collector 20 of transistor 14 is connected to the base 22 of transistor 12, thus forming a regenerative loop to enable SCR action. A positive gating signal applied to the control terminal 24 drives base 18 rendering transistor 14 conductive which in turn draws current out of base 22 thereby rendering transistor 12 conductive whereby current flows through collector 16 to base 18 thus forming a regenerative loop which sustains conduction after removal of the signal from terminal 24.

The anode emitter of SCR 6 has a split emission path 26 and 28 having a common connection to main anode terminal 8. Path 26 emits current for the SCR regenerative loop. Path 28 emits current to the base 30 of power transistor 4 to render the latter conductive. Device 2 is thus turned ON as follows: a positive gating signal at terminal 24 renders transistor 14 conductive which in turn renders transistor 12 conductive; upon conduction of transistor 12, a regenerative loop is established through SCR 6 which maintains conduction between main terminals 8 and 10 even upon removal of the gating signal from control terminal 24; also upon conduction of transistor 12, an emission path 28 to base 30 is established to drive transistor 4 into conduction which carries load current between main terminals 8 and 10, whereby device 2 is ON.

The SCR anode emitter has a resistance 32 in emitter path 26, whereby when transistor 12 is conductive, most of the current from main anode terminal 8 flows through emission path 28, with only a small, low level holding current flowing through emission path 26. This holding current is at or above the minimum value necessary to sustain the regenerative loop in SCR 6, whereby the latter may be easily turned off by a small negative gating signal at control terminal 24. Upon non-conduction of SCR 6, transistor 12 is non-conductive and hence no current is emitted from the SCR anode emitter, whereby neither emission path 26 nor 28 is active, thus terminating base drive to transistor 4 rendering the latter non-conductive and thus device 2 is OFF.

The substrate drawing of FIG. 2 shows the structure of the integrated configuration. P region 34 and N region 36 form a series aiding diode 38, FIG. 1. Power transistor 4 is formed by N region 40, P region 42 and N region 44, forming collector, base and emitter, respectively. SCR 6 is formed by anode emitter P region 46, N region 40, P region 48 and N cathode region 50; regions 46, 40 and 48 form emitter, base and collector, respectively, of composite PNP transistor 12 of FIG. 1, and regions 40, 48 and 50 form collector, base and emitter, respectively, of composite NPN transistor 14 of FIG. 1.

Resistance 32 of FIG. 1 is formed by the lateral dimension of anode emitter P region 46 on the SCR side. This resistance forces most of the emission to the left emission path 28, and provides for only a small, low level holding emission in the right path 26 sufficient to maintain regeneration of the SCR. The lateral dimension 52 of P region 42 is made large enough to prevent regenerative action between anode emitter 46 and power transistor 4. N+ region 54 prevents vertical SCR regenerative action due to the low minority carrier lifetime in the N+ region, and also enables low saturation resistance of power transistor 4. There is thus provided a vertical power transistor integrated on a common substrate with a lateral SCR having a split emission path. Power transistor 4 is vertical for high current capacity, and SCR 6 is lateral for easy access and terminal connection purposes.

The device of FIG. 2 may also be designed totally planar with the elimination of the bottom PN junction. All of the load current must then flow through anode emitter 46, path 28, which would result in a higher gain structure but would also result in a higher saturation resistance.

What is claimed is:

1. A monolithically integrated gate turn-off device comprising:

a pair of main terminals for carrying load current;

a control terminal which enables said device to be turned ON by signal current of one polarity, and be turned OFF by signal current of the opposite polarity;

non-regenerative switching means formed by a plurality of regions in a substrate, and connected between said main terminals for carrying load current when biased into conduction by base drive current, and being non-conductive in the absence of said base drive current whereby said device is OFF;

regenerative switching means formed by a plurality of serially laterally contiguous regions in said substrate one of which is a gate region connected to said control terminal, said regenerative switching means being connected in parallel with said non-regenerative switching means between said main terminals for carrying current when gated into conduction by said signal current of said one polarity applied to said control terminal, and remaining conductive upon removal of said signal current because of regenerative loop current flowing through said regenerative switching means between said main terminals, another region of said regenerative switching means being an emitter region connected to one of said main terminals, said emitter region having a split emission current path comprising a first emission current path supplying current for the remaining regions of said regenerative switching means to supply said regenerative loop current therethrough, and a second emission current path supplying current to said non-regenerative switching as said base drive current;

said device being turned ON by said signal current of said one polarity applied to said control terminal rendering said regenerative switching means conductive, including current emission from said emitter region in both said emission paths, said second emission path supplying said base drive current to said non-regenerative switching means rendering the latter conductive to thus carry load current between said main terminals; and resistance means in said first emission current path causing higher emission in said second emission current path, such that said device in said ON state carries high capacity load current through said non-regenerative switching means between said main terminals, and carries a small low level holding current through said regenerative switching means between said main terminals of sufficient magnitude to maintain said regenerative loop;

said device being easily turned OFF by a small signal current of opposite polarity applied to said control terminal, which readily renders said regenerative switching means non-conductive because of the low level of said holding current, whereby emission from said emitter region is stopped, thus terminating said base drive current supplied through said second emission current path and rendering said non-regenerative switching means non-conductive, hence terminating load current between said main terminals;

whereby there is afforded the combination of a lateral low level regenerative loop, afforded by said regenerative switching means, having a split emission current path, the second of which controls a higher current capacity, afforded by said non-regenerative switching means, in order to achieve high turn-off gain by breaking the regenerative loop with a small signal.

2. The invention according to claim 1 wherein:

said non-regenerative switching means comprises a power transistor formed by first, second and third regions of alternating conductivity type;

said regenerative switching means comprises a thyristor formed by first, second, third and fourth regions of alternating conductivity type;

said first thyristor region is said emitter region and is disposed on a top surface of said substrate and is ohmically connected to said one main terminal;

said fourth thyristor region is disposed on said top surface of said thyristor to one side of said first thyristor region and is ohmically connected to the other of said main terminals;

said third power transistor region is disposed on said top surface of said substrate to the other side of said first thyristor region and is ohmically connected to said other of said main terminals in parallel with said fourth thyristor region;

said first thyristor region being of laterally extended dimension in the direction of said fourth thyristor region to provide said resistance means in said first emission current path.

3. The invention according to claim 2 wherein said second power transistor region is of laterally extended dimension in the direction between said third power transistor region and said first thyristor region in order to prevent regenerative action therebetween.

4. The invention according to claim 3 wherein said non-regenerative switching means is vertically formed in said substrate and further comprises a diode formed by first and second regions of alternating conductivity type in series with said power transistor and separated therefrom by a region of said substrate, said first diode region being disposed on a bottom surface of said substrate and ohmically connected to said one main terminal in parallel with said first thyristor region, said last mentioned separating substrate region preventing vertical regenerative action between said diode and said transistor.

5. The invention according to claim 4 formed by the following vertically aligned regions in said substrate, from bottom to top:

said first diode region of one conductivity type;

said second diode region of opposite conductivity type;

said separating substrate region of differently doped said opposite conductivity type to enable low transistor saturation resistance and also provide low minority carrier lifetime to block vertical regenerative action;

said first power transistor region of said opposite conductivity type;

said second power transistor region of said one conductivity type; and said third power transistor region of said opposite conductivity type;

and also formed by the following laterally aligned regions in said substrate, each having at least a portion disposed on said top surface;

said third power transistor region of said opposite conductivity type;

said second power transistor region of said one conductivity type;

said first power transistor region of said opposite conductivity type;

said first thyristor region of said one conductivity type;

said second thyristor region common with said first transistor region and of said opposite conductivity type;

said third thyristor region of said one conductivity type ohmically connected to said control terminal; and said fourth thyristor region of said opposite conductivity type.

* * * * *